United States Patent [19]

Van de Walle et al.

[11] Patent Number: 5,383,211
[45] Date of Patent: Jan. 17, 1995

[54] TM-POLARIZED LASER EMITTER USING III-V ALLOY WITH NITROGEN

[75] Inventors: Chris Van de Walle, Menlo Park; David P. Bour, Cupertino, both of Calif.

[73] Assignee: Xerox Corporation, Stamford, Conn.

[21] Appl. No.: 146,758

[22] Filed: Nov. 2, 1993

[51] Int. Cl.[6] .......................... H01S 3/10; H01S 3/18
[52] U.S. Cl. .......................................... 372/43; 372/45
[58] Field of Search ............................ 372/45, 46, 43

[56] References Cited

U.S. PATENT DOCUMENTS

| | | | |
|---|---|---|---|
| 4,804,639 | 2/1989 | Yablonovitch | 372/45 |
| 5,079,774 | 1/1992 | Mendez et al. | 372/45 |
| 5,117,469 | 5/1992 | Cheung et al. | 372/45 |
| 5,216,684 | 6/1993 | Wang et al. | 372/45 |

OTHER PUBLICATIONS

"Band lineups and deformation potentials in the model-solid theory", Chris G. Van de Walle, Physical Review B, ©1989 The American Physical Society, vol. 39, No. 3, 15 Jan. 1989-II.

"A Comparison of the Wurtzite and Zincblende Band Structures for SiC, AlN and GaN", W. R. L. Lambrecht and B. Segall, Mat. Res. Soc. Symp. Proc. vol. 242, 1992 Materials Research Society, no month available.

Primary Examiner—Rodney B. Bovernick
Assistant Examiner—Robert McNutt
Attorney, Agent, or Firm—Rosen, Dainow & Jacobs

[57] ABSTRACT

A semiconductor laser source using a strained active layer of InGaAsN, introduced by the addition of N in the alloy, to obtain semiconductor laser sources that emit TM-polarized light in the wavelength range above 850 nm. The presence of N in the alloy reduces the lattice constant and produces the desired strain effect, i.e., biaxial tension which raises the light hole band (yielding TM polarization) and produces a narrowing of the band gap. Adding In can reduce the strain in the alloy while maintaining the desired band gap and light-hole/heavy-hole ordering.

12 Claims, 3 Drawing Sheets

TM-POLARIZED LASER EMITTER USING III-V ALLOY WITH NITROGEN

This invention relates to semiconductor lasers employing quantum well active layers.

RELATED APPLICATIONS (1) Commonly-assigned, prior-filed application, Ser. No. 07/994,029, filed Dec. 12, 1992, entitled "MULTIPLE BEAM SOLID-STATE QW LASER USING CONFIGURED STACKED LAYERS," in the names of Robert C. Thornton, Gregory J. Kovacs, and David P. Bour.

(2) Commonly-assigned, prior-filed application, Ser. No. 07/948,524, filed Sep. 22, 1992, entitled "MULTIBEAM, ORTHOGONALLY-POLARIZED EMITTING MONOLITHIC QUANTUM WELLLASERS", in the names of D. W. Treat, D. P. Bour and T. L. Paoli.

(3) Commonly-assigned, prior-filed application, Ser. No. 07/948,522, filed Sep. 22, 1992, entitled, "POLARIZATION SWITCHABLE QUANTUM WELL LASER", in the names of D. W. Treat, D. P. Bour and T. L. Paoli.

(4) Commonly-assigned application, Ser. No. 08/173,812, filed Dec. 23, 1993, entitled "DUAL POLARIZATION LASER DIODE WITH QUATERNARY MATERIAL SYSTEM".

BACKGROUND OF THE INVENTION

There exist many applications for laser diodes and arrays of laser diodes that can emit TM-polarized light or simultaneously or selectively emit separable light from different array elements. Examples are color printing, full color digital film, recording, color displays, and optical recording and playback systems. Building a laser array into a monolithic structure in which the emitting regions are closely spaced offers a further important advantage that all of the optical sources can share a common lens system. It is also desirable in a number of these applications that the emitting regions in the monolithic structure are individually addressable, and it is also desirable to be able to individually detect such closely-spaced beams and process any information contained as a result of beam modulation at the source or by reflection from or transmission through optical media.

There are several ways to generate from a laser diode light beams with a unique characteristic. One way is to control its polarization.

The first above-referenced related application, Ser. No. 07/994,029, whose contents are herein incorporated by reference, describes a structure for generating dual polarization beams from a monolithic, addressable, laser diode chip. The structure comprises a stack of epitaxially-deposited layers including multiple, vertically-stacked QW heterostructures of similar or different compositions but capable of generating light that is differently polarized. The different QW structures can be at different levels. By selective etching and/or diffusion techniques, laterally-spaced different QW structures can be isolated and separately activated for individual addressing.

The second and third above-referenced related applications, Ser. Nos. 07/948,524 and 07/948,522, whose contents are herein incorporated by reference, describe the construction and method of manufacture on a common substrate of individually addressable quantum well (QW) lasers that can be caused to oscillate in the transverse electric (TE) or in the transverse magnetic (TM) mode, and QW laser constructions that can be switched from oscillating in the TE polarization mode to the TM polarization mode, or vice versa. This has been accomplished in certain material systems by controlling the type of strain induced in an epitaxially deposited active region due to lattice mismatches with the substrate. Thus, in most material systems allowing heavy hole and light hole transitions, when the n=1 heavy hole is the lowest energy state and therefore the state whose population is most easily inverted, usually true for unstrained and compressively strained III-V alloy systems, TE polarization gain will predominate. However, by reversing the light hole and heavy hole band edges, achieved in certain material systems by inducing tensile strain into the active region, TM polarization gain will predominate. In the degenerate condition, where the light hole and heavy hole bands are substantially coincident in energy, the polarization of the emission can be determined by threshold carrier density and other factors, such as temperature, facet reflectivity, cavity length and intracavity optical loss.

In general, the desired result of controlling polarization can be achieved with either a single QW, carefully adjusted, or separate Qws for TE and TM mode gain, respectively, with the polarization mode of laser oscillation dependent upon the gain characteristic and the threshold gain. The necessary gain characteristic has one polarization with lowest transparency current, and the orthogonal polarization with a greater peak gain. For some range of active region parameters (thickness, composition, placement within the confining region, etc.), these characteristics can be obtained, and so the polarization will be determined by the threshold gain. Therefore, the polarization of each device can be selected, for example by introducing an additional loss into one of the devices, thereby forcing it to oscillate in the higher-gain polarization. On the other hand, a device without this additional loss will simply oscillate in the polarization which has the lowest transparency current. The additional loss could be an unpumped section along the cavity, low mirror reflectivity, shorter cavity, etc. Similarly, the polarization of each device could be switched, by using an intracavity loss modulator. This polarization selectivity mechanism is demonstrated by the polarization-dependent gain-current characteristics shown in FIG. 1.

In the graph of FIG. 1, the abscissa represents current and the ordinate represents gain of an active layer having the characteristics described above, with the curve 10 labelled TE showing that, under certain conditions, the QW when caused to lase at the lower threshold 11 will emit TE-polarized radiation. Under other conditions, usually by introducing loss, when the threshold current exceeds the crossover 12, the QW will lase in the higher gain, TM mode represented by the curve 13.

Applying the principles described above to the material systems disclosed in the referenced prior applications resulted in laser devices that could emit in the spectral range below about 850 nm. However, there are important applications for such laser devices that emit significantly above the 850 nm limit.

SUMMARY OF THE INVENTION

An object of the invention is a semiconductor laser source that emits polarized light in the wavelength range above 850 nm.

Another object of the invention is a solid-state, monolithic laser capable of emitting TM-polarized light over a wider wavelength range.

A further object of the invention is a solid-state QW laser grown on a GaAs substrate and capable of emitting TM-polarized light in the wavelength range above 850 nm.

Still a further object of the invention is a laser capable of emitting in the 850 nm and higher range TE- or TM-polarized radiation under control of a user or fabricator, or capable of being switched from one polarization mode to its orthogonal polarization mode, or capable of emitting multiple beams with orthogonal polarizations.

The referenced prior applications describe subjecting the active layer to biaxial tension, parallel to the plane of the active p-n junction of the laser diode to obtain the orthogonal polarization modes. To accomplish this requires a III-V compound alloy material that has a lattice constant smaller than that of the substrate on which the active layer is deposited in the conventional manner by known spitaxial techniques. However, the III-V semiconductors mentioned in the related applications that have lattice constants smaller than, for example, the common substrate, GaAs, all have bandgaps significantly larger than that of GaAs, which therefore means that a laser source built with such a strained active layer would emit at wavelengths smaller than that corresponding to GaAs, i.e., smaller than 900 nm.

We have discovered that a strained alloy containing nitrogen can be used as an active layer to obtain both TM-polarization and a bandgap smaller than that of GaAs, resulting in longer wavelength radiation in the range above 850 nm.

Specifically, we have discovered in a preferred embodiment that a QW laser diode employing as the active layer a tensile-strained layer of InGaAsN allows TM-mode lasers at wavelengths up to about 1100 nm.

The existence of a laser source of TM-polarized light in the 850–1100 nm wavelength range opens up many new applications including raster output scanning (ROS) printing, monolithic frequency-doubled lasers using second harmonic generation into the green or blue wavelength regions, polarization switchable lasers, dual polarization laser arrays, and multiwavelength dual polarization arrays.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENT

TM polarization can be obtained by subjecting the active layer to biaxial tension, parallel to the plane of the junction. For growth on, for example, GaAs substrates, one therefore requires a material with a lattice constant smaller than GaAs. The III-V semiconductors with lattice constant smaller than GaAs all have band gaps significantly larger than GaAs, and one therefore expects to be able to fabricate only sources which emit at wavelengths smaller than that corresponding to GaAs.

We have found that strained GaAsN alloys can be used to obtain both TM polarization and a band gap smaller than that of GaAs. The presence of N in the alloy reduces the lattice constant and produces the desire strain effect (biaxial tension, which raises the light hole band yielding TM polarization). Unstrained GaAsN alloys have a band gap larger than GaAs; however, biaxial tension also produces a narrowing of the band gap. It turns out that the strain-induced gap narrowing is larger than the composition-induced widening, leading to a net reduction in the gap. These alloys can therefore be used to emit light at longer wavelengths than GaAs.

Figure 2:
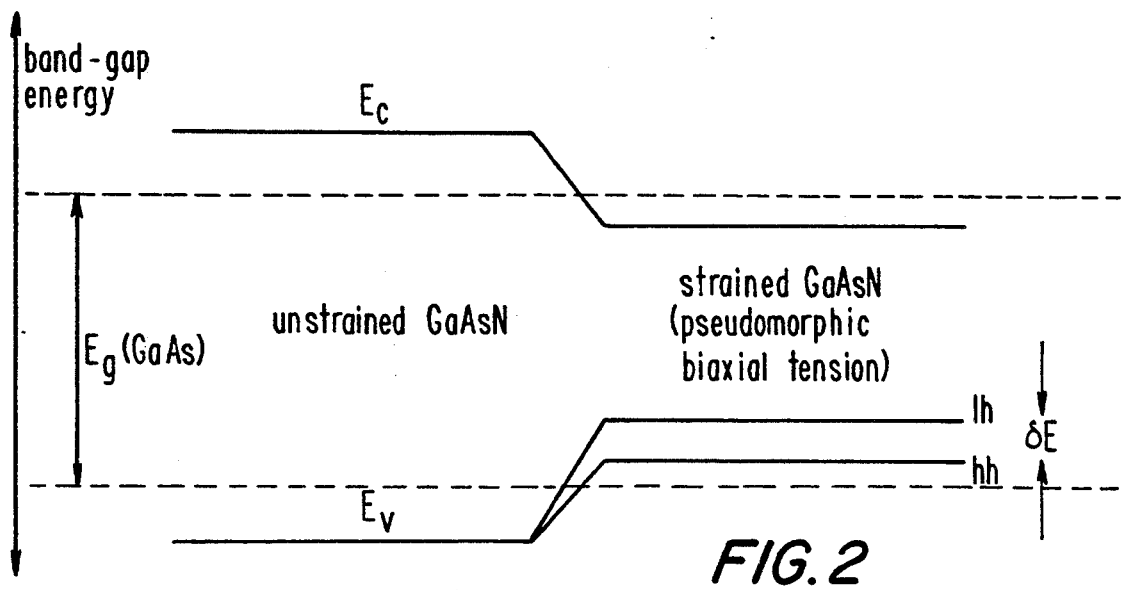
FIG. 2 shows the effects of biaxial tension upon the band-gap energies of GaAsN grown on (Al)GaAs.

FIG. 2 illustrates the effect. In this band diagram, the ordinate represents, as usual, increasing energy upward, Ec the conduction band, Ev the valence band, hh the heavy hole level, lh the light hole level, and $\delta E$ the energy gap between the light hole and heavy hole levels. To the left is shown the band diagram for unstrained GaAsN, to the right that for strained GaAsN, and the dotted lines represent the band gap of GaAs for comparison. FIG. 2 shows the effect of biaxial tension upon the band gap energies of GaAsN grown pseudomorphically on (Al)GaAs. Although unstrained GaAsN has a greater band gap than GaAs, biaxial tension reduces the band gap and makes the light hole band lh the valence band ground state, allowing TM-mode lasers at wavelengths greater than 850 nm.

To produce a significant decrease in the gap (of the order of several tenths eV), the nitrogen content in the alloy needs to be sufficiently high; for instance, to reduce the gap by 0.4 eV (yielding a wavelength of 1100 nm), the nitrogen content has to be at least 25%. Such large concentrations of nitrogen will induce large strains, requiring a reduction in the critical layer thickness, which is the thickness above which undesirable strain-induced dislocations appear.

In accordance with a further feature of the invention, the net strain can be reduced (and the critical layer thickness increased) by adding indium (In) to the alloy. The band gap of InAs is smaller than that of GaAs, so that an additional narrowing of the gap may be expected; however, the strain effects act in the opposite direction here. It turns out that as long as the strain is tensile, the band gap is not very sensitive to the addition of In. The main purpose of adding In, then, is to reduce the strain in the alloy while maintaining the desired band gap and light hole/heavy hole ordering to produce the desired polarization mode. To achieve this effect, the In concentration can vary between 0 and 100%.

InGaAsN alloys of the invention can be used as active layers in a laser structure, surrounded by, preferably, AlGaAs layers which act as barriers. A typical device structure is equivalent to more conventional (TE-mode) (In)GaAs/AlGaAs lasers, with the exception of the quantum well composition of the invention. A typical device of the ridge type is illustrated schematically in FIG. 3 and comprises a GaAs substrate 20 on which are epitaxially grown in the conventional manner AlGaAs cladding layers 21, 25, AlGaAs confining regions 22, 23 flanking an active QW layer 24 of InGaAsN, ridge or mesa cap layer 26, and contact layer 27. Electrodes 28 and 29 at top and bottom provide the injection current for the active layer 24. The layers 30 flanking the ridge 26 are typically of regrown GaAs. The various layers other than the active layer 24, can have conventional thickness (examples are given in the referenced applications). If desired, an etch-stop layer, for example, of GaAs (20–100Å) can be provided between the layer 25 and regrown layer 30. Not shown are the usual reflecting facets forming the optical cavity at opposite ends.

Figure 3:
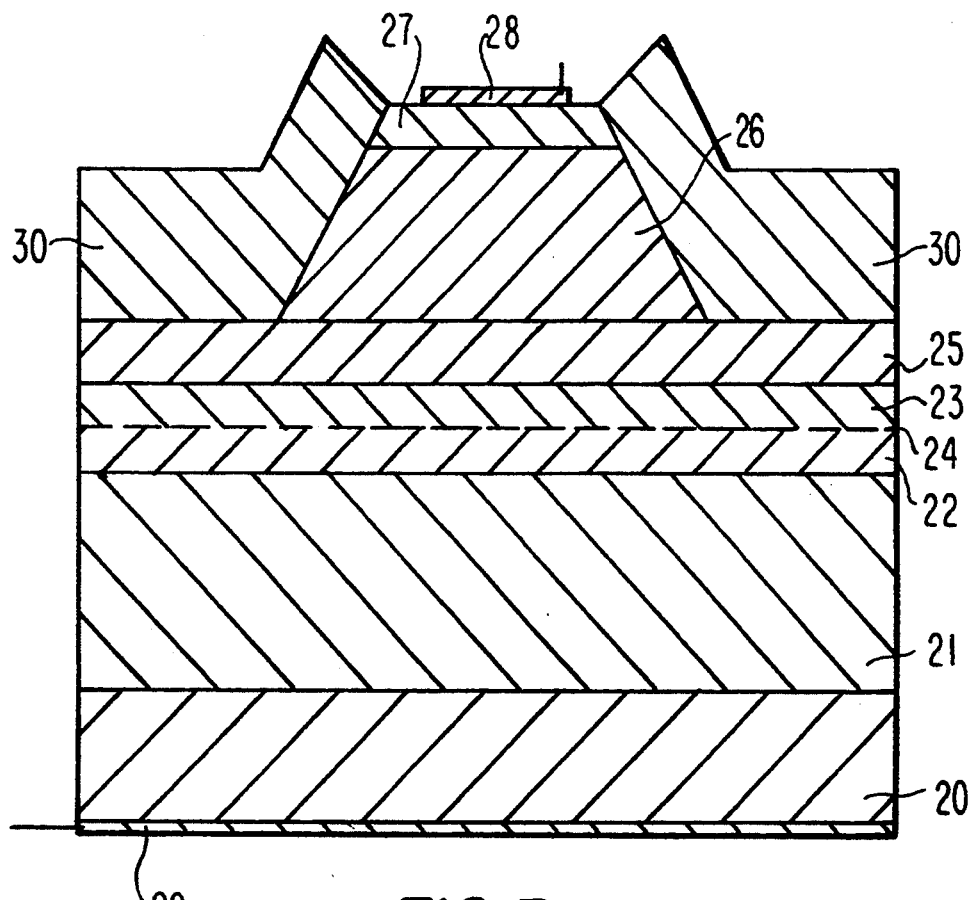
FIG. 3 is a schematic view of one form of TM-mode laser diode of the invention.
Figure 4:
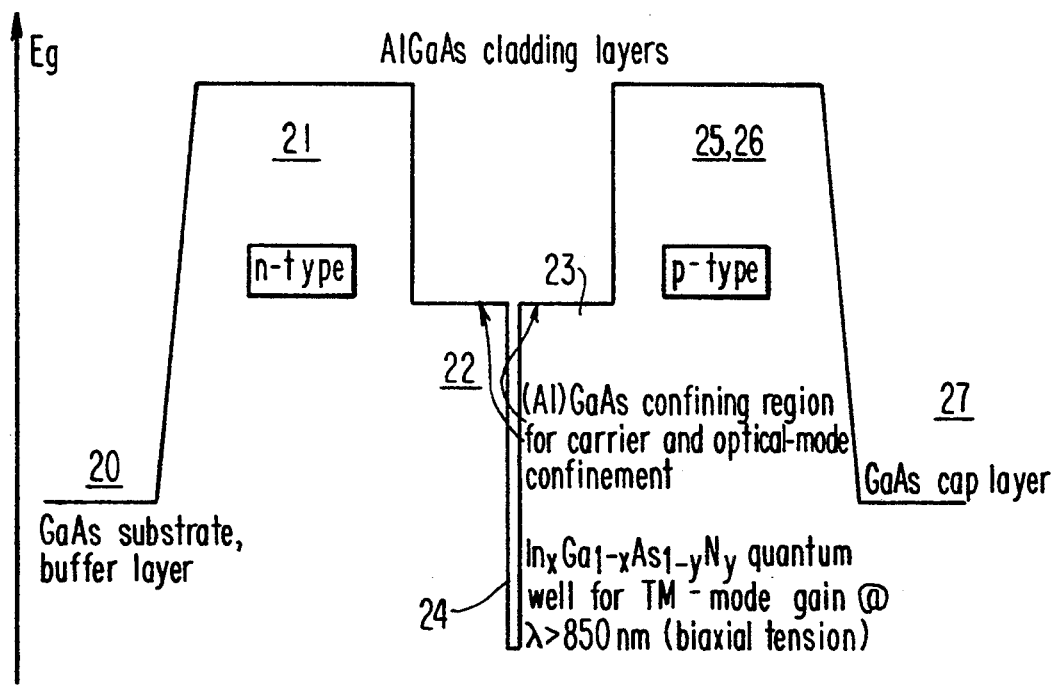
FIG. 4 shows the band-gap profile of the TM-mode laser diode of FIG. 3 with a single quantum well.

The band gap energy profile for the FIG. 3 diode laser is illustrated at FIG. 4, which also shows that in the usual way the conductivity types below (FIG. 3) the typically undoped quantum well region are n-type, and those above are p-type, with the exception of the regrown regions 30 which are n-type for lateral carrier confinement.

The effects described here can be quantitatively evaluated using the known band gaps and deformation potentials for the binary materials [see, e.g., C. G. Van de Walle, Phys. Rev. B39, 1871 (1989); W. R. L. Lambrecht and B. Segall, Mat. Res. Soc. Symp. Proc. 242, 367 (1992)]. The resulting expressions are particularly simple if linear interpolation is assumed (nonlinear effects such as bowing will enhance the desired band gap narrowing). We give the formulas here for the case of growth on a (111) substrate, which is particularly relevant in case the laser source would be used for frequency doubling in a ferroelectric oxide grown epitaxially on the laser structure. The expressions for the (001) orientation are qualitatively similar.

For the $In_xGa_{1-x}As_{1-y}N_y$ alloy, the in-plane, biaxial strain is given by $\epsilon_\approx = -0.076x + 0.204y$.

In the following expressions we assume that $y > 0.37x$, so that the strain is tensile and the desired TM polarization will be obtained. The change in the band gap is then given by $\Delta E_g = 0.13x - 1.55y$, and the splitting between light and heavy hole bands is $\delta E = -0.55x + 1.47y$.

As an example, we choose $x = 0.4$ and $y = 0.2$; then $\epsilon_\approx = 0.01$, which is small enough to ensure a sufficient critical layer thickness of at least 20 nm of the QW layer 24; $\Delta E_g = -0.26$ eV, which shifts the emission wavelength by 170 nm compared to GaAs; and $\delta E = 0.07$ ev, which will be sufficient to make the light-hole state the ground state.

Figure 6:
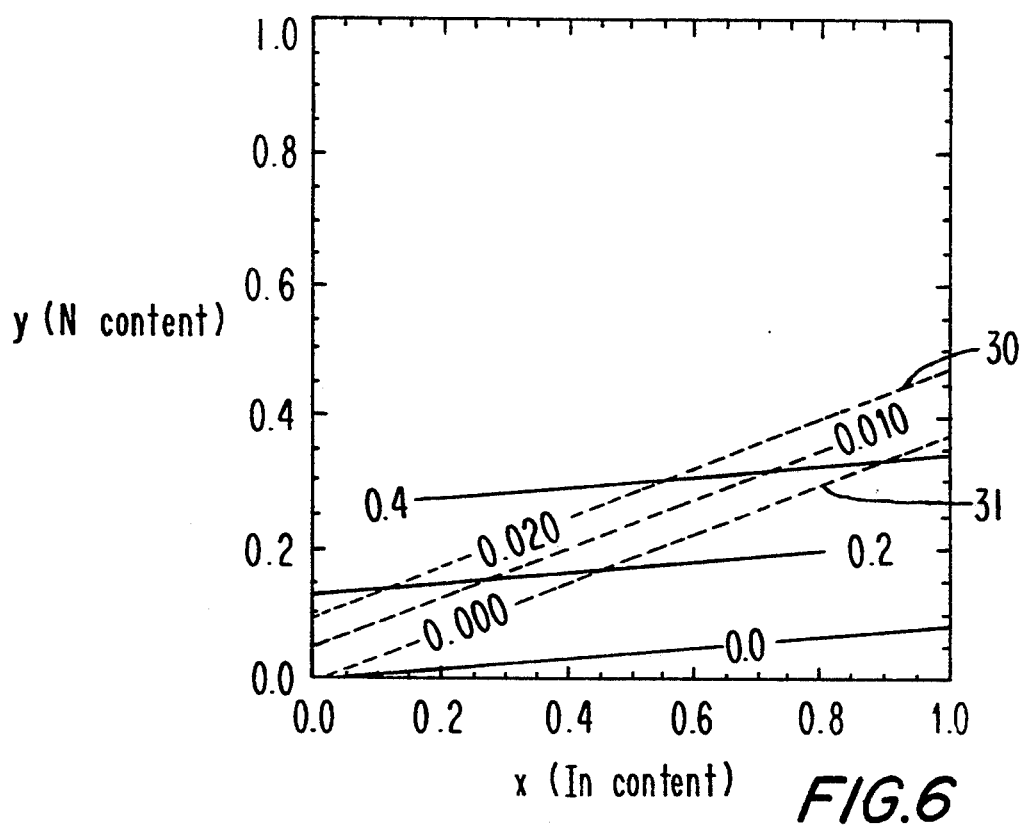
FIG. 6 is a contour plot showing how alloy composition affects strain and band gap.

As will be apparent from the foregoing, concentrations of N and In can vary over a wide range, depending on the desired properties of the laser. To assist those skilled in this art in choosing appropriate values, the graph of FIG. 6 provides an insight in how the alloy composition, $In_xGa_{1-x}As_{1-y}N_y$, affects the strain and the band gap. FIG. 6 is a contour plot where the horizontal axis (x) corresponds to the In content of the alloy, and the vertical axis (y) corresponds to the N content of the alloy. The solid lines are lines of constant value for the change in band gap, $\Delta E_g$; values of 0, −0.2, and −0.4 eV are shown. The dotted lines are lines of constant value for the in-plane strain, $\epsilon_\approx$; values of 0, 0.01, and 0.02 are shown. The figure is only valid for positive values of $\epsilon_1$ (i.e., tensile strain). The magnitude of 0.02 for $\epsilon_1$, designated 30, corresponds to a typical upper limit for strain that is tolerable in a quantum well. Acceptable (x,y) values should therefore lie between the dotted lines for $\epsilon_{25} = 0$ designated 31 and $\epsilon_1 = 0.02$ designated 30. To design a structure, one could then pick a desired value for $\Delta E_g$, and find values of x and y which produce this reduction in the band gap, while keeping the strain within acceptable bounds. The strain, of course, directly determines the splitting $\delta E$ between light and heavy hole bands. FIG. 6 indicates that depending on the application x can vary anywhere between 0 and up to 1, while y will vary between greater than 0 and 0.5.

The addition of Sb to the GaAsN alloy, instead of or in addition to the In, could also accomplish the desired effect of lessening the strain, while maintaining the band gap narrowing and TM polarization. However, InGaAsN alloys are easier to grow than GaAsNSb; hence, we prefer to use the In.

We note that the addition of In beyond x = 0.37 y makes the heavy hole state the ground state, resulting in TE polarization.

Using such an InGaAsN or GaAsNSb or InGaAsNSb quantum well active region expands the range of wavelengths available from TM-mode diode lasers. While the GaInP/AlGaInP material system described in the second and third related applications covers the 600–650 nm range, the 600–850 nm range is spanned by strained InGaAsP or AlGaAsP quantum wells in AlGaAs or AlGaInP confining regions as described in the fourth related application, whose contents are herein incorporated by reference. TE-mode lasers are already well-developed for $850 < \lambda < 1100$ nm, using biaxially compressed InGaAs/AlGaAs Qws. The present alloy system of GaAsN, including InGaAsN or InGaAsNSb, also with lower band gap than GaAs, but which experiences biaxial tension when grown on AlGaAs, covers the gap for TM-mode lasers in the 850–1100 nm spectral range.

Figure 1:
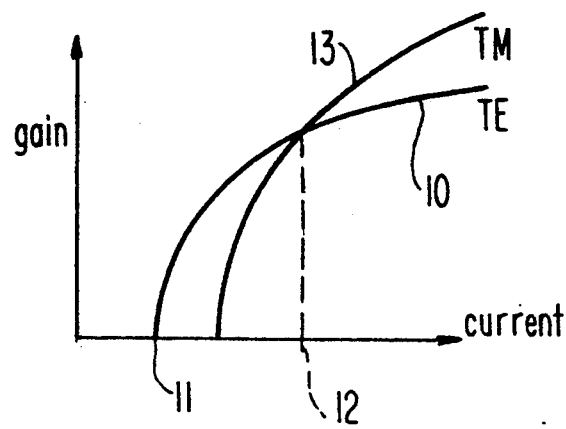
FIG. 1 is a graph showing the gain-current relationship for one form of a dual polarization or polarization switchable laser device in accordance with the invention.

Using the alloy system of the invention, it is also possible to adjust exactly the thickness and composition of a single QW, so that the light hole and heavy hole band edges are degenerate or very nearly degenerate. In this case, a TE/TM mode switchable device can be made, since the gain available in each polarization can be made roughly similar. The polarization of the laser emission will be determined by the threshold gain, and the gain-current relationship for each mode as described in connection with FIG. 1 and in the third related application. From such a structure, dual-polarization laser arrays can be made, with adjacent lasers emitting in orthogonal polarizations. This can be achieved by controlling the threshold gain through, for example, appropriate facet-coatings, an intracavity modulator section, temperature, etc., as described in said related application.

Figure 5:
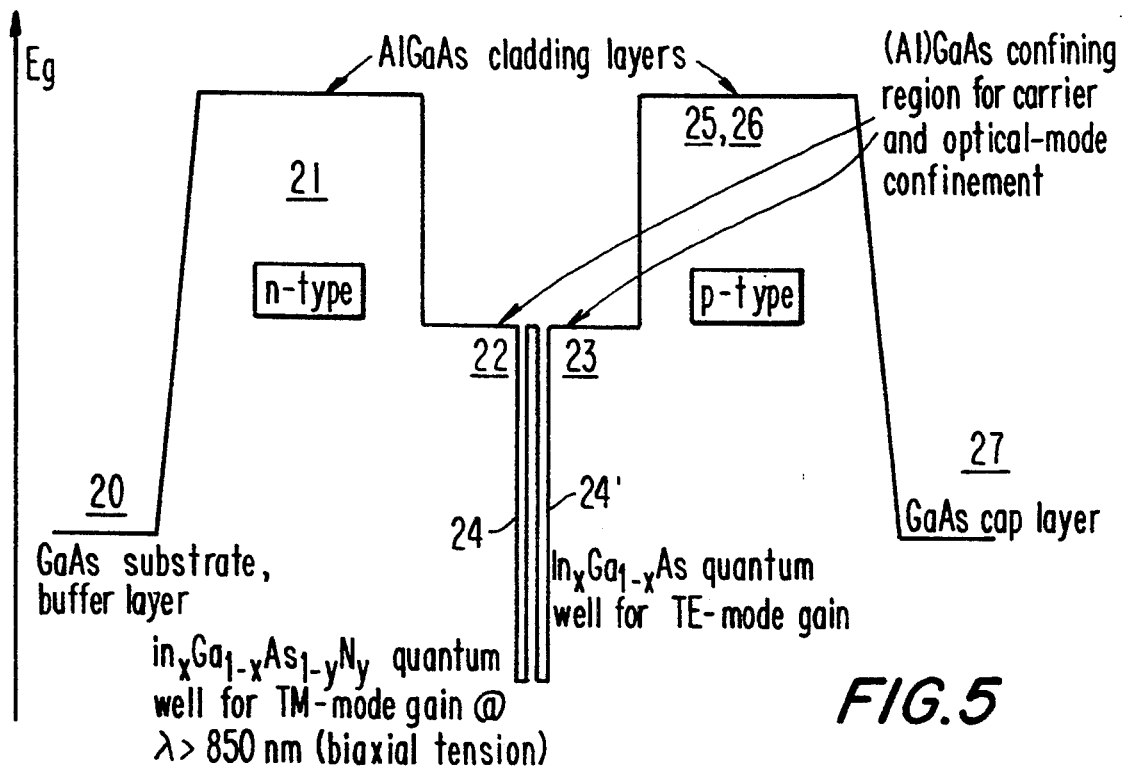
FIG. 5 is a band-gap energy profile similar to that of FIG. 4 for a multi-QW laser diode in accordance with the invention.

A layer structure capable of either TE- or TM-mode emission can also include separate QWs for TE- and TM-mode gain. For example, shown in FIG. 5 is the band gap energy profile for a two-QW structure which contains a biaxially compressed InGaAs QW 24' for TE-mode gain at $\lambda > 850$ nm, and an InGaAsN QW 24 under biaxial tension for TM-mode gain at the same wavelength. As in the case of a single, exactly-adjusted QW, the polarization will depend on the gain and loss characteristics. In principle, the QWs can be adjusted so that one polarization has a lower transparency current, while the other has a greater gain. Therefore, the low-threshold polarization oscillates when the loss is low, and the high-gain (and higher threshold) polarization dominates when an additional loss is introduced.

The structure represented by FIG. 5 is similar to that of FIG. 3, except that the second QW layer 24' for TE-mode gain is added. The significant relationships are the InGaAsN/AlGaAs combination for TM-mode gain, and the InGaAs/AlGaAs combination for TE-mode gain, both at a wavelength, λ, exceeding 850 nm.

For a single QW structure whose bandgap profile is illustrated in FIG. 4, the thickness of the AlGaAs cladding layers 21, 25 are conventional, typically varying in the range of 0.5–1.5 μm. Typical compositions are $Al_xGa_{1-x}As$, with $0.2 \leq x \leq 1.0$.

Other GaAs-lattice-matching materials can be used, such as $(AlGa)_{0.5}In_{0.5}P$.

The confining regions of AlGaAs will typically have a thickness of 10 to 200 nm, with the Al content chosen to shift the bandgap upward so as to obtain a lower index of refraction and optical confinement. Typically, the value of x representing the Al content in the formula $Al_xGa_{1-x}As$ will vary between 0 and 0.5. Other materials such as $Ga_{0.5}In_{0.5}P$ and $(AlGa)_{0.5}In_{0.5}P$ can be substituted.

For the nitrogen-containing active layer, the thickness preferably is between 1 and 50 nm, and in the formula $In_xGa_{1-x}As_{1-y}N_y$, x will range between 0 and 1, with y being greater than 0.37 X, and between 0 and 0.5.

For the dual QW structure of FIG. 5, the dimensions and compositions indicated above for corresponding elements can be the same. For the formula, $In_xGa_{1-x}As$, of the TE-mode gain well, x can range between 0 and 0.4.

Other compositions can be substituted for this TE-mode gain QW, such as GaAsSb, and $In_xGa_{1-x}As_{1-y}N_y$ with $y<0.37x$.

It will be understood that the invention is not limited to the ridge waveguide structure illustrated in FIG. 3, but also applies to stripe geometries, buried hetero junction structures, and other well-known semiconductor laser structures formed with III-V alloys with single or multiple QW systems. Also, any of the well-known epitaxy fabrication techniques, such as LP-MO-VPE, MBE and LPE, can be used to make the multi-layer crystalline structures, and if desired known techniques for selecting a narrow range of wavelengths for oscillation, such as gratings inside or outside the active region can be provided in the structure.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. This scope of the invention is indicated by the appended claims rather than by the foregoing description.

What is claimed is:

1. A laser diode comprising:
   (a) a crystalline substrate of GaAs having a first lattice constant and a first bandgap,
   (b) a crystalline active layer deposited over said substrate, said active layer comprising a III-V alloy and having a second lattice constant smaller than said first lattice constant and a second bandgap when unstrained, said active layer when deposited over said substrate being strained such that said active layer has a third bandgap when strained that is smaller than the first bandgap,
   (c) electrodes for injecting carriers into the active layer to thereby cause laser emission in said active layer at a wavelength exceeding the wavelength of laser emission of a material having the first bandgap.

2. The laser diode of claim 1, wherein the active layer comprises nitrogen.

3. The laser diode of claim 2, wherein the active layer comprises $In_xGa_{1-x}As_{1-y}N_y$, where x varies between 0 and 1 and y varies between 0 and 0.5.

4. The laser diode of claim 3, wherein $y>0.37x$, and the laser emission is TM-polarized.

5. The laser diode of claim 3, wherein the active layer has a thickness of 1–50 nm.

6. The laser diode of claim 2, wherein the active layer comprises antimony.

7. A laser diode comprising:
   (a) a crystalline substrate of a III-V alloy comprising GaAs and having a first lattice constant and a first bandgap,
   (b) a crystalline active layer deposited over said substrate, said active layer comprising a III-V alloy with the addition of nitrogen such that said active layer has a second lattice constant smaller than said first lattice constant and a second bandgap when unstrained, said active layer when deposited over said substrate being strained such that said active layer has a third bandgap when tensile-strained, that is smaller than the first bandgap,
   (c) electrodes for passing current through the active layer to thereby cause laser emission from said active layer at a wavelength exceeding 850 nm.

8. The laser diode of claim 7, wherein the active layer comprises InGaAsN, and further comprising confinement layers flanking the active layer, said confinement layers comprising GaAs or AlGaAs.

9. The laser diode of claim 8, wherein the active layer emits TM-polarized light, and further comprising a second active layer capable of emitting TE-polarized light.

10. The laser diode of claim 9, wherein the second active layer comprises InGaAs.

11. The laser diode of claim 7, wherein the laser emission is TM-polarized.

12. The laser diode of claim 7, wherein the active layer is such that its light hole and heavy hole band edges are nearly degenerate and exhibits a gain-current relationship such that one polarization mode has a higher transparency current and the orthogonal polarization mode has a higher peak gain whereby the laser diode can be caused to emit TE- or TM-polarized light.

* * * * *